(12) United States Patent
Zhang et al.

(10) Patent No.: US 7,872,236 B2
(45) Date of Patent: Jan. 18, 2011

(54) CHARGED PARTICLE DETECTION DEVICES

(75) Inventors: Xu Zhang, Hayward, CA (US); Joe Wang, Sunnyvale, CA (US); Zhong-Wei Chen, San Jose, CA (US)

(73) Assignee: Hermes Microvision, Inc., Hsin-Chu (TW)

( * ) Notice: Subject to any disclaimer, the term of this patent is extended or adjusted under 35 U.S.C. 154(b) by 387 days.

(21) Appl. No.: 11/668,846

(22) Filed: Jan. 30, 2007

(65) Prior Publication Data

US 2009/0090866 A1   Apr. 9, 2009

(51) Int. Cl.
*G01T 1/20* (2006.01)

(52) U.S. Cl. ..................................... 250/368
(58) Field of Classification Search ............... 250/368
See application file for complete search history.

(56) References Cited

U.S. PATENT DOCUMENTS

| | | | |
|---|---|---|---|
| 4,068,123 A | | 1/1978 | Kokubo |
| 4,675,524 A | | 6/1987 | Frosien et al. |
| 4,700,075 A | * | 10/1987 | Kurz et al. ................ 250/368 |
| 4,713,543 A | | 12/1987 | Feuerbaum et al. |
| 4,728,790 A | | 3/1988 | Plies |
| 4,808,821 A | | 2/1989 | Feuerbaum et al. |
| 4,818,874 A | | 4/1989 | Ishikawa |
| 4,831,266 A | | 5/1989 | Frosien et al. |
| 4,926,054 A | | 5/1990 | Frosien |
| 5,004,918 A | | 4/1991 | Tsuno |
| 5,198,675 A | * | 3/1993 | Hikita et al. ................ 250/397 |
| 5,498,874 A | | 3/1996 | Miyoshi et al. |
| 5,665,968 A | | 9/1997 | Meisburger et al. |
| 5,717,204 A | | 2/1998 | Meisburger et al. |

(Continued)

FOREIGN PATENT DOCUMENTS

DE    3925949 A1 *  2/1991

OTHER PUBLICATIONS

K Tsuno, "Aberration Analysis of a Wein Filter for Electrons", Optik, vol. 89, No. 1, (1991), pp. 31-40, Wissenschaftliche Verlagsgesellschaft MBH.

(Continued)

*Primary Examiner*—Constantine Hannaher
(74) *Attorney, Agent, or Firm*—Sawyer Law Group, P.C.

(57) ABSTRACT

A charged particle detector consists of four independent light guide modules assembled together to form a segmented on-axis annular detector, with a center opening for allowing the primary charged particle beam to pass through. One side of the assembly facing the specimen is coated with or bonded to scintillator material as the charged particle detection surface. Each light guide module is coupled to a photomultiplier tube to allow light signals transmitted through each light guide module to be amplified and processed separately. A charged particle detector is made from a single block of light guide material processed to have a cone shaped circular cutout from one face, terminating on the opposite face to an opening to allow the primary charged particle beam to pass through. The opposite face is coated with or bonded to scintillator material as the charged particle detection surface. The outer region of the light guide block is shaped into four separate light guide output channels and each light guide output channel is coupled to a photomultiplier tube to allow light signal output from each channel to be amplified and processed separately.

21 Claims, 9 Drawing Sheets

U.S. PATENT DOCUMENTS

| | | | |
|---|---|---|---|
| 5,872,358 A | 2/1999 | Todokoro et al. | |
| 6,194,729 B1 | 2/2001 | Weimer | |
| 6,365,896 B1 | 4/2002 | van der Mast | |
| 6,380,546 B1 | 4/2002 | Petrov et al. | |
| 6,392,231 B1 | 5/2002 | Chen | |
| 6,407,387 B1 | 6/2002 | Frosien et al. | |
| 6,426,501 B1 | 7/2002 | Nakagawa | |
| 6,462,467 B1 | 10/2002 | Russ | |
| 6,463,124 B1 | 10/2002 | Weisman et al. | |
| 6,545,277 B1 | 4/2003 | Kella et al. | |
| 6,605,805 B2 | 8/2003 | Chen | |
| 6,617,579 B2 | 9/2003 | Yonezawa | |
| 6,642,520 B2 | 11/2003 | Kimura et al. | |
| 6,768,324 B1 | 7/2004 | Yamada et al. | |
| 6,775,452 B2 * | 8/2004 | Howells | 385/128 |
| 6,853,143 B2 | 2/2005 | Nakasuji et al. | |
| 6,855,938 B2 | 2/2005 | Preikszas et al. | |
| 6,960,766 B2 | 11/2005 | Chen | |
| 6,972,412 B2 | 12/2005 | Scholtz et al. | |
| 6,975,125 B2 | 12/2005 | Yamada et al. | |
| 7,067,807 B2 | 6/2006 | Petrov et al. | |
| 7,098,468 B2 | 8/2006 | Aloni et al. | |
| 7,161,667 B2 | 1/2007 | Meeks et al. | |
| 7,180,317 B2 | 2/2007 | Hollman | |
| 7,312,449 B2 | 12/2007 | Nakasuji et al. | |
| 7,385,195 B2 | 6/2008 | Yamada et al. | |
| 7,521,700 B2 | 4/2009 | Aloni et al. | |
| 7,544,937 B2 | 6/2009 | Frosien | |
| 7,598,499 B2 | 10/2009 | Platzgummer | |
| 7,612,337 B2 | 11/2009 | Suzuki et al. | |
| 7,645,989 B2 | 1/2010 | Bihr et al. | |
| 7,652,263 B2 | 1/2010 | Feuerbaum | |
| 7,705,298 B2 | 4/2010 | Liu et al. | |
| 7,705,301 B2 | 4/2010 | Tseng et al. | |
| 7,759,653 B2 | 7/2010 | Chen et al. | |
| 2003/0155509 A1 | 8/2003 | Nakasuji et al. | |
| 2004/0239347 A1 | 12/2004 | Yamada et al. | |
| 2005/0023491 A1 | 2/2005 | Young et al. | |
| 2005/0133733 A1 | 6/2005 | Nakasuji et al. | |
| 2006/0202119 A1 | 9/2006 | Yamada et al. | |
| 2006/0243918 A1 | 11/2006 | Aloni et al. | |
| 2008/0067380 A1 | 3/2008 | Ozawa et al. | |
| 2008/0099693 A1 | 5/2008 | Platzgummer | |
| 2008/0217529 A1 | 9/2008 | Sukegawa et al. | |
| 2008/0315094 A1 | 12/2008 | Wang et al. | |
| 2009/0090866 A1 | 4/2009 | Zhang et al. | |
| 2009/0242792 A1 | 10/2009 | Hosoya et al. | |
| 2009/0294664 A1 | 12/2009 | Chen et al. | |
| 2010/0028235 A1 | 2/2010 | Qin et al. | |
| 2010/0102227 A1 | 4/2010 | Chen et al. | |
| 2010/0118310 A1 | 5/2010 | Matsui | |
| 2010/0150429 A1 | 6/2010 | Jau et al. | |

OTHER PUBLICATIONS

Ludwig Reimer, "Image Formation in Low-Voltage Scanning Electron Microscopy", SPIE Optical Engineering Press, Tutorial Texts vol. TT 12, 1993, 16 total pages (pp. 12, 13, 28-41, 88-101).

Ronnie Porat, et al., "SEM-based methodology for root cause analysis of wafer edge and bevel defects", IEEE/SEMI Advanced Semiconductor Manufacturing Conference, pp. 11-12, 2008.

Jaime D. Morillo, et al., "Edge and Bevel Automated Defect Inspection for 300mm Production Wafers in Manufacturing", IEEE/SEMI Advanced Semiconductor Manufacturing Conference, pp. 1-4, 2005.

* cited by examiner

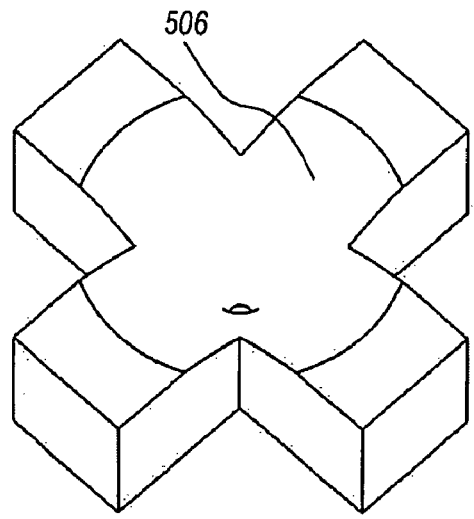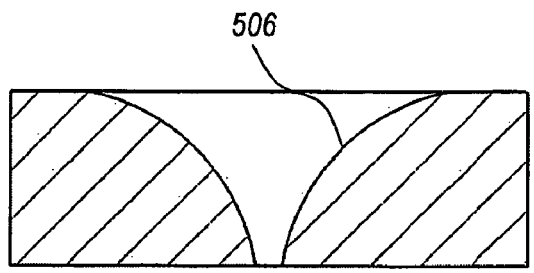
FIG. 5G  FIG. 5H
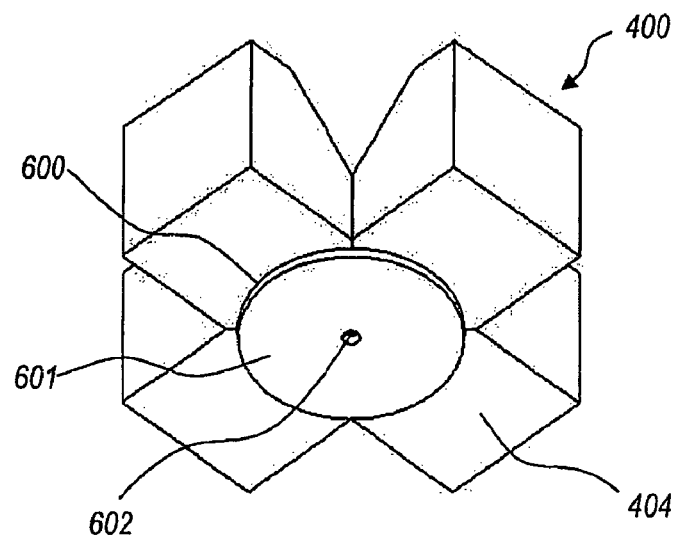
FIG. 6

CHARGED PARTICLE DETECTION DEVICES

FIELD OF THE INVENTION

The present invention relates generally to detection devices and more particularly to charged particles detection devices.

BACKGROUND OF THE INVENTION

A charged particle detector is an indispensable part of charged particle (ion or electron beam) instruments, such as a scanning electron microscope (SEM). In a SEM, an electron beam emanated from an electron source is focused into a fine probe over a specimen surface and scanned by a deflection unit in a raster fashion; and signal electrons released from the specimen, including secondary electrons and back scattered electrons, are collected by charged particle detectors and the signal intensity is converted into the gray level of an image pixel corresponding to the location of the electron probe on the specimen surface. Scanning of the electron probe will then form a gray level mapping thus producing an image of the specimen surface. A low voltage SEM, in which an incident electron beam has the energy of 3 keV or less, is known to be particularly effective in evaluating topographic features of the specimen surface due to the dominance of secondary electrons in the signal electrons. Secondary electrons are originated within a shallow depth from the specimen surface; their yield and trajectory are influenced by the surface topography and thus carry the topographic information. (A detailed description on all aspects of low voltage SEM operation can be found in "Image Formation in Low Voltage Scanning Electron Microscopy" by L. Reimer, SPIE Optical Engineering Press, 1993.)

The most common detectors used in SEM are of the scintillator-photomultiplier tube (PMT) combination type (such as an Everhart-Thornley detector), the semiconductor type, and the microchannel plate type. The scintillator-PMT type, due to their high gain and low noise properties, is more frequently used in high resolution SEMs in which the beam current is low. Traditionally this type of detector is made of a light guide rod, its front face coated with a light-generating scintillator, coupled to a photomultiplier tube. A common arrangement is to position one or a multiple of these units below the final focusing objective lens, surrounding the impact point of the primary electron beam, with the front face covered with a positively biased grid to attract secondary electrons emitted from the specimen in what amounts to a side detection scheme (see, for example, U.S. Pat. No. 4,818,874). This is schematically illustrated with detector 108 in FIG. 1, where the basic structure of a SEM is shown and the side detector 108 is inserted between the objective lens 103 and the specimen 104. Recently, increased demand on low voltage SEMs of higher resolution has prompted more widespread use of SEMs with an immersion type of objective lens for its ability to provide finer electron probes due to smaller electron optical aberrations. In a SEM with an immersion type of objective lens, the specimen is immersed in the strong magnetic focusing field of the objective lens, over which an electrostatic extraction field is also typically superimposed. While the main purpose is to focus the primary electron beam, the magnetic field also confines the secondary electron trajectories close to the central optical axis, with the electrostatic field acting to pull the electrons away from the specimen into the center bore of the objective lens. In this case, side detectors can no longer receive any secondary electrons, and in-lens detectors must be used instead. For the best secondary electron collection efficiency, on-axis annular type in-lens detector is preferred. An example is shown with detector 109 in FIG. 1, which is positioned on the optical axis 110, with a center hole in the middle for the primary charged particle beam 111 to pass through.

It is well known in the art that segmented on-axis annular detectors can be used for enhancing topographic features on the specimen surface without specimen tilt. Such a detector is divided into equal halves or quarters, with signal output from each segment processed and displayed separately. An example is shown in FIG. 2. Secondary electrons 205B emanated from side surface 204L of a surface feature 208 strike only detector half 206B, while those 205A from side surface 204R strike only detector half 206A, after crossing the optical axis under the focusing effect of the magnetic immersion field from the objective lens 203. When the signals from each half are added together as in a non-segmented detector case, both edges of the feature will show up bright in the image (as shown in the line profile 2A) as more secondary electrons are emitted along the side wall region, making it difficult to discern whether the feature 208 is a protrusion or a depression. However, when the signal from each half is displayed separately, a shadow effect is created with one edge of the surface feature 208 showing up bright while the other showing up dark, as shown in the line profile 2B from detector half 206A and the line profile 2C from detector half 206B, creating a three-dimensional impression which helps to determine that the feature 208 is a protrusion.

Segmented on-axis annual detectors have been most commonly constructed with semiconductor or microchannel plate type of detectors due to their planar nature, which can be easily made into a segmented round plate. Examples include a back-lens detector where the detector is placed upstream in the back of the objective lens, and a front lens Robinson detector where the detector is attached to the lower face of the objective lens pole piece facing the specimen. Processing of the signals from each segment of the detector, including addition or subtraction, can provide large quantity of information of the specimen including topographic and material information. However, segmented on-axis annual detectors are rarely made with Scintillator-PMT type of detectors doe to the difficulty in light-guide design because of their non-planar nature, even though this type of detector can be the superior choice in many cases. In those cases, either a single detector is used on axis or multiple detectors are arranged separately around the center optical axis, often working in conjunction with a reflection plate which generates its own secondary electrons to be collected by the detectors, when the plate is struck by the secondary and back-scattered electrons coming from the specimen (see, for example, U.S. Pat. No. 6,617,579). These arrangements are schematically illustrated in FIG. 1, with multiple in-lens detectors 106A and 106B positioned off axis in conjunction with a reflection plate 107, or a single Scintillator-PMT detector 105 positioned on axis. For the multiple detector arrangement the construction is complicated and the signal collection efficiency is not the best due to the spatial separation of the individual detectors, while for the single on-axis detector case it is difficult to achieve a uniform signal collection due to the non-rotational-symmetric nature of the light-guide tube.

Accordingly, there is a need in the art for innovative designs for charged particle detectors, so that the high efficiency space saving segmented on-axis annular configuration or its equivalent can be realized for Scintillator-PMT type of detectors.

BRIEF SUMMARY OF THE INVENTION

If is an object of this invention to provide for designs for a segmented on-axis annular charge particle detector utilizing Scintillator-PMT type of detectors, specifically designs for light guides in order to achieve the segmented on-axis annular configuration will be disclosed. In one embodiment of the charged particle detector in accordance with the present invention, four light guide modules are assembled in a rotational symmetric configuration to form a single assembly, with a square center opening on the center optical axis for allowing the primary charged particle beam to pass through. The flat side of the assembly feeing the specimen is coated with or coupled to scintillator material. Each light guide module is coated with aluminum for internal light reflection and light separation between adjacent modules, except the light exit face which is coupled to PMT modules to allow signals transmitted from each prism to be amplified and processed separately.

In another embodiment of the charged particle detector in accordance with the present invention, four light guide modules are shaped in a way so that they can be assembled together in a mirror symmetric configuration to form a single assembly, with a square or round center opening on the center optical axis for allowing the primary charged particle beam to pass through. The flat side of the assembly facing the specimen is coated with or coupled to with scintillator material. Each light guide module is coated with aluminum for internal light reflection and light separation between adjacent modules, except the light exit face which is coupled to PMT modules to allow signals transmitted from each prism to be amplified and processed separately.

In yet another embodiment of the charged particle detector in accordance with the present invention, a single light guide material is machined to have a cone shaped circular cutout from one side, with the tip of the cone terminating on the opposite side to an opening to allow the primary charged particle beam to pass through. The opposite side is coated with or coupled to scintillator material. The outer region of the light guide is shaped into four light guide channels and coupled to PMT modules. The whole light guide is coated with aluminum for internal light reflection except the light incoming and exiting faces.

A further understanding of embodiments in accordance with the present invention can be made by way of reference to the ensuing detailed description taken in conjunction with the accompanying drawings.

BRIEF DESCRIPTION OF THE DRAWINGS

FIG. 6 shows a detector assembly in accordance with the fourth embodiment of the present invention.

DETAILED DESCRIPTION OF THE INVENTION

The present invention relates generally to detection devices and more specifically to charged particles detection devices. The following description is presented to enable one of ordinary skill in the art to make and use the invention and is provided in the context of a patent application and its requirements. Various modifications to the preferred embodiments and the generic principles and features described herein will be readily apparent to those skilled in the art. Thus, the present invention is not intended to be limited to the embodiments shown, but is to be accorded the widest scope consistent with the principles and features described herein.

Figure 1:
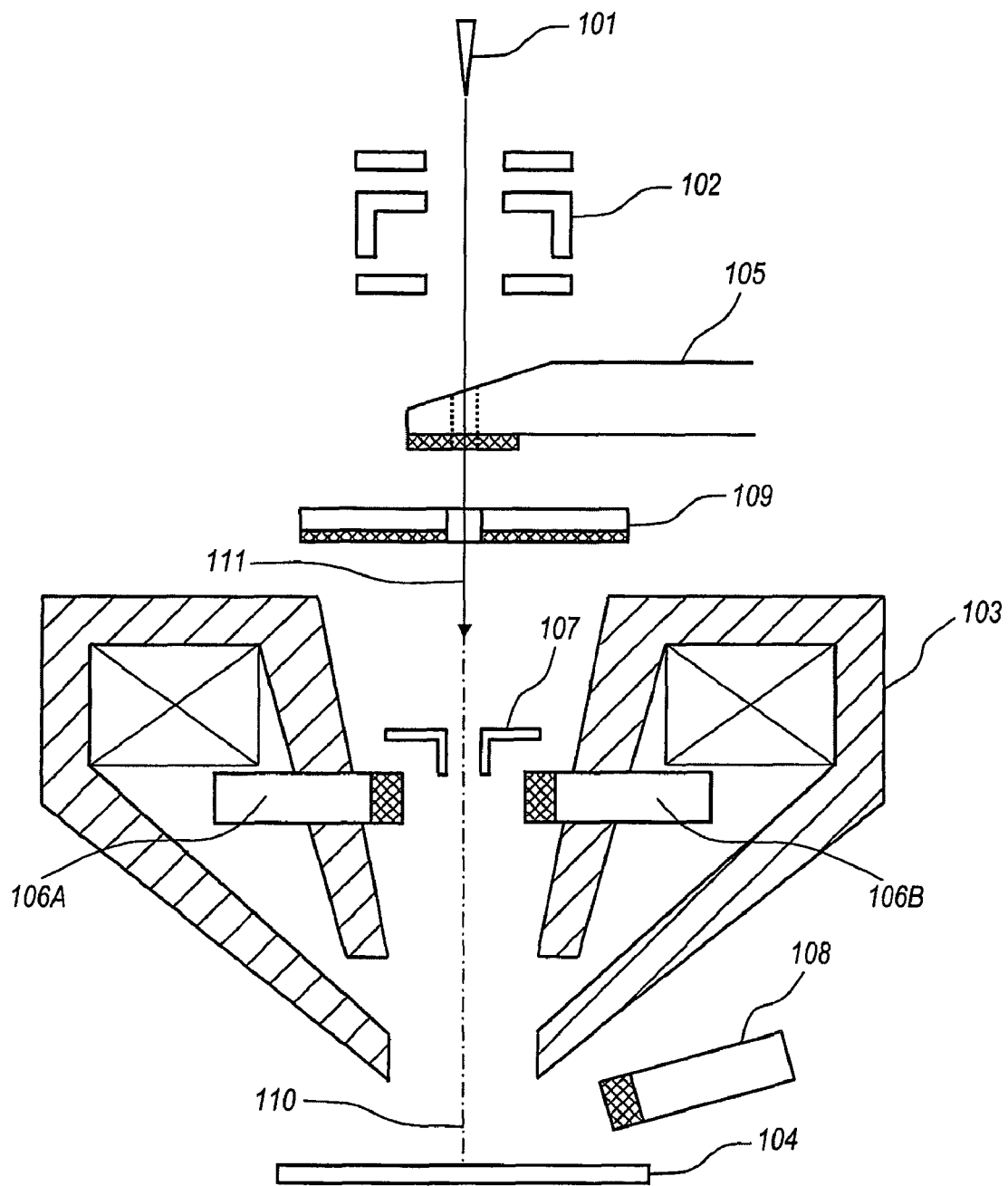
FIG. 1 is a schematic illustration of a SEM and prior art electron detection systems.
Figure 2:
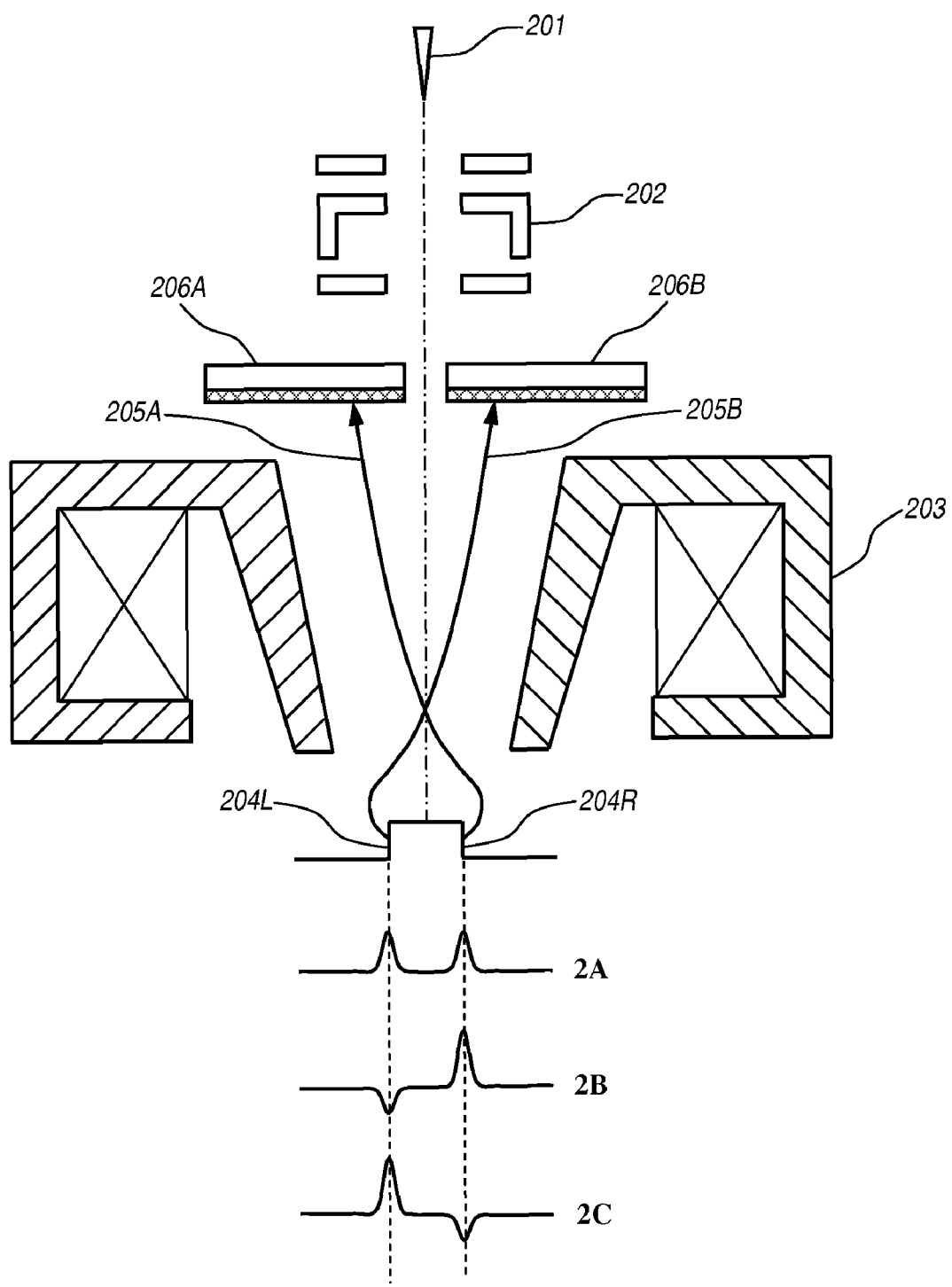
FIG. 2 is a schematic illustration of a SEM with an immersion type of magnetic objective lens and on-axis detectors, illustrating the benefit of segmented on-axis annual detectors in enhancing the appearance of surface topographic features.
Figures 3A, 3B:
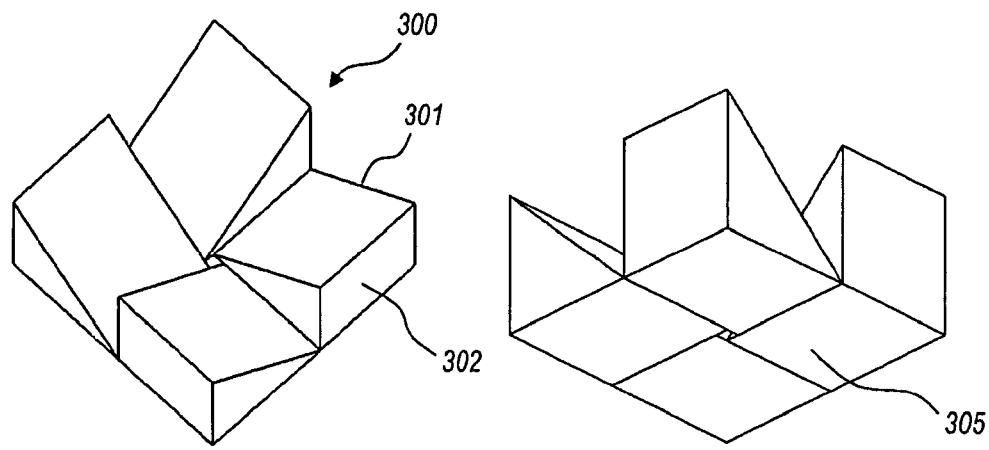
FIG. 3 shows detector assemblies in accordance with the first embodiment of the present invention.
Figures 3C, 3D:
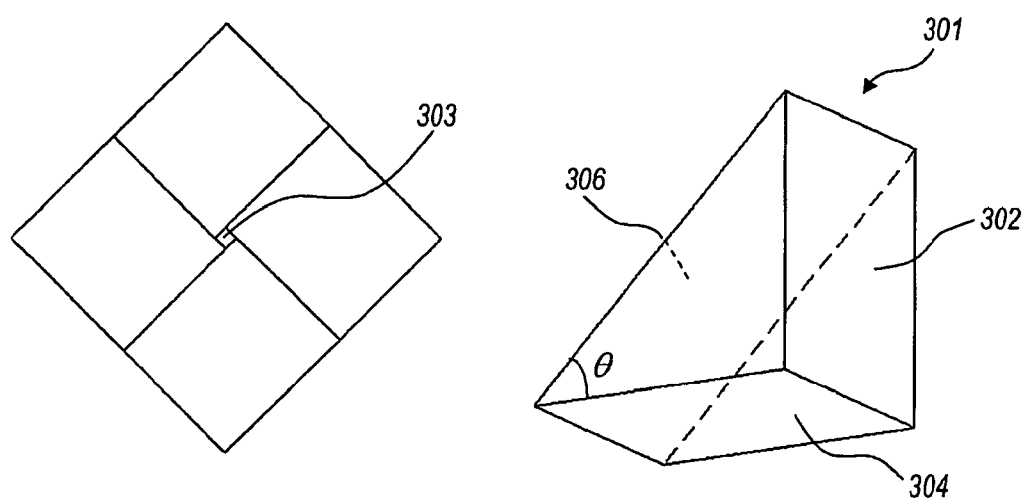
Figures 3E, 3F:
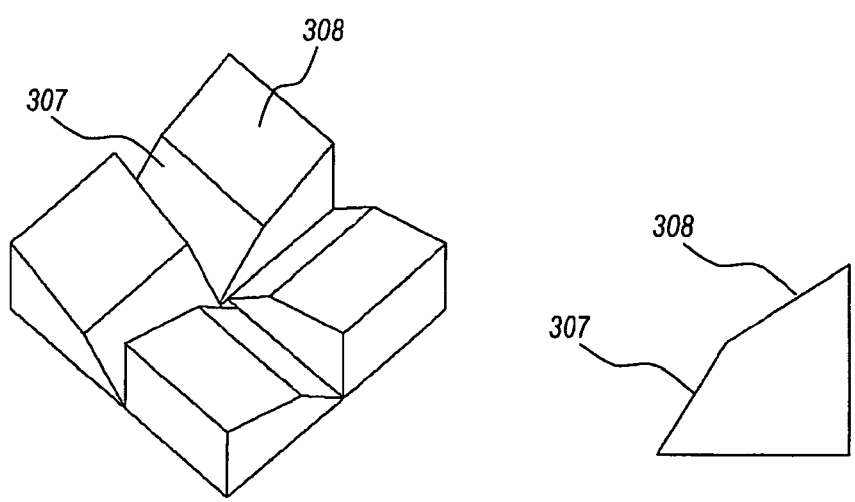
Figure 3G:
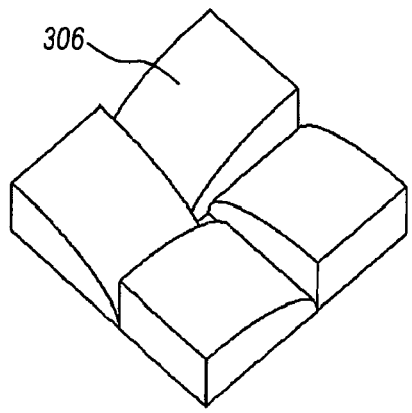
Figure 3H:
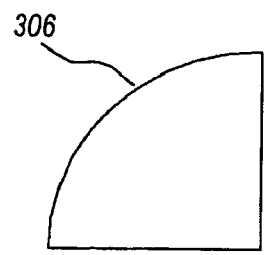
Figure 3I:
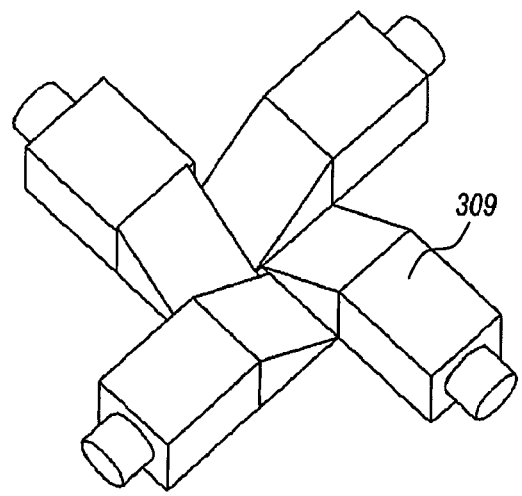
Figure 3J:
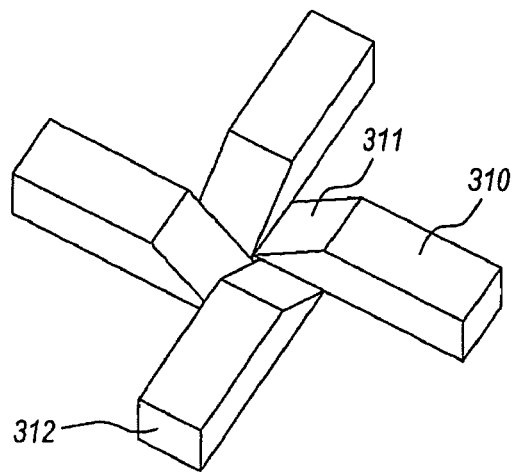

A first embodiment of a charged particle detector assembly in accordance with the present invention will be described in detail with reference to FIG. 3A through FIG. 3J. FIG. 3A, FIG. 3B and FIG. 3C shows the tilted top view, tilted bottom view, and top view of the detector light guide assembly 300, respectively. As illustrated in FIG. 3A, four individual triangular prisms 301 (as shown in FIG. 3D), acting as light guides segments, are assembled in an off-center configuration to form a light guide assembly 300, with a square opening 303 in the center as shown in FIG. 3C. Before the assembly, one of the leg faces 304 of each triangular prism 301 is coated with scintillator material (for example, phosphor scintillator such as P47) to form a detection surface, and then each prism is over coated with aluminum or other reflective material for internal light reflection and light isolation between adjacent modules except the light exit face 302. Four prisms 301 are then assembled with leg face 304 coplanarly to form a flat detection surface 305 as shown in FIG. 38. As shown in FIG. 3C, each prism 301 is offset sideways with respect to the center opening 303. When viewed from the top the whole assembly is 90-degree rotational symmetric, but not mirror symmetric with respect to the central axis of the center opening 303. This kind of configuration has the benefit of simple construction, as it can be readily constructed from commercially available prisms without, any modification. For example, common right angle prisms can be used. When installed in a charged particle instrument, the opening 303 will be aligned with the center optical axis of the instrument for allowing the primary charged particle beam to pass through. The angle θ between bottom face 304 and sloped face 306 of each prism 301 can be any value between 0 and 90 degrees as shown in FIG. 3D, in accordance with the present invention. In addition, even though a triangular prism 301 is shown in this example being used as the light guide, it by no means limits the shape of the light guide to be triangular. Various shapes and curves can be applied to the sloped face 306 in accordance with the present invention, as may be deemed necessary due to light collection efficiency consideration. For example, face 306 can be separated into several flat segments of different slopes. FIG. 3E shows tilted top view of one of such embodiments, where the sloped face of each light guide assembly includes two flat segments 307 and 308 with different slopes (its side view is shown in FIG. 3F). Face 306 can also follow curved shapes, such as circular, parabolic, spherical or any other curved profile or surface. FIG. 3G shows tilted top view of one of such embodiments, where the face 306 of each Sight guide segment has a circular profile (its side view is shown in FIG. 3H). As shown in FIG. 3I, the light exit face 302 of each light guide segment is coupled to a PMT module 309 to allow light signals transmitted through each light guide segment to be converted, amplified and processed separately. It can be easily understood to people familiar with the art that this configuration constitutes an on-axis annular detector with four equal and independent segments. In this example, the PMT modules 309 are directly attached to the exit face of the light guide segments for compactness and minimum loss of light intensity. However, within the scope of the present invention, additional solid or hollow light guide extensions or optical fiber light guide section can also be incorporated between the PMT 309 and exit face 302 of each segment, as may be required due to practical needs of the instrument in which the detector will be installed. One example of such an embodiment is shown in FIG. 3J, where the extended light guide section 310 is manufactured together with the triangular prism section 311 to form a single prism-light guide unit. Again each segment is over coated with aluminum or other reflective material for internal light reflection except for the light exit face 312 off each segment.

Figure 4E:
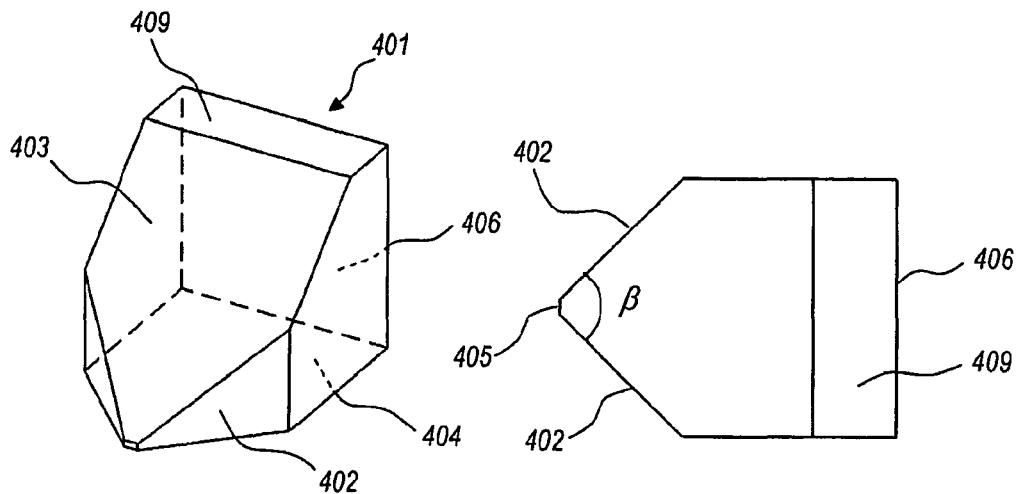
FIG. 4 shows detector assemblies in accordance with the second embodiment of the present invention.
Figure 4E:
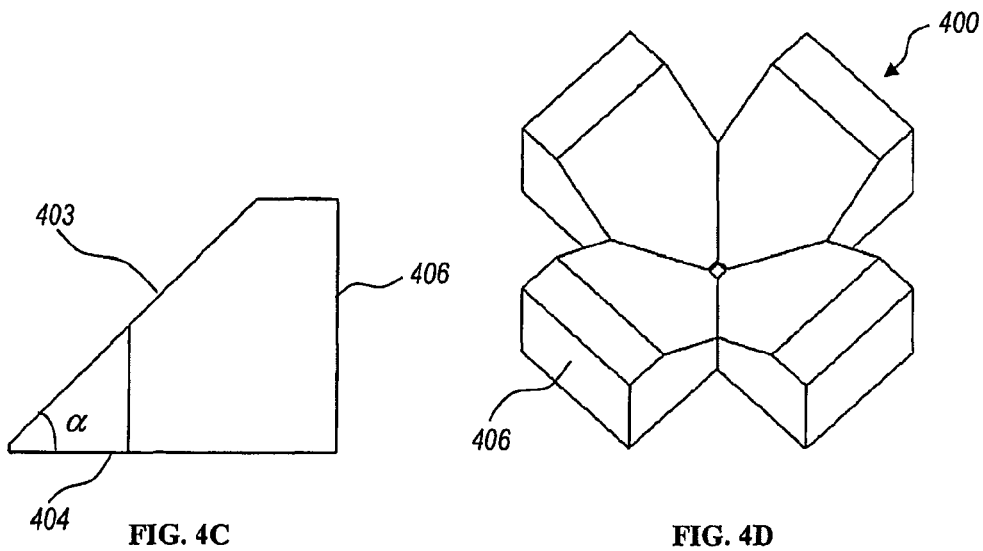
Figure 4E:
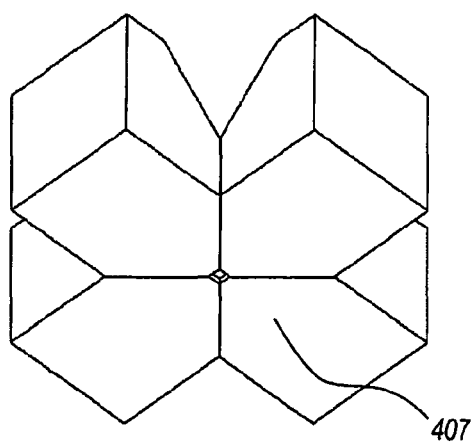
Figure 4F:
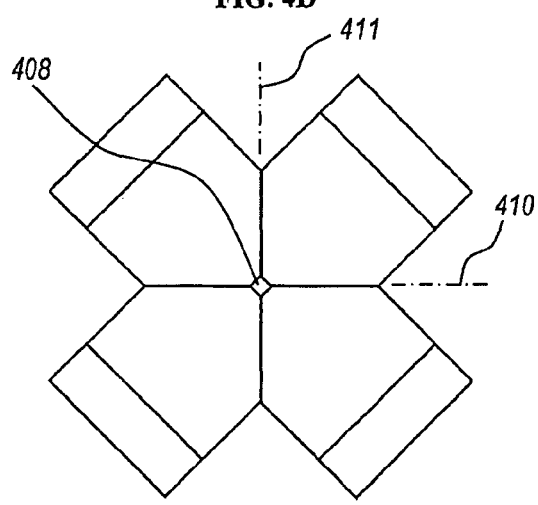
Figure 4G:
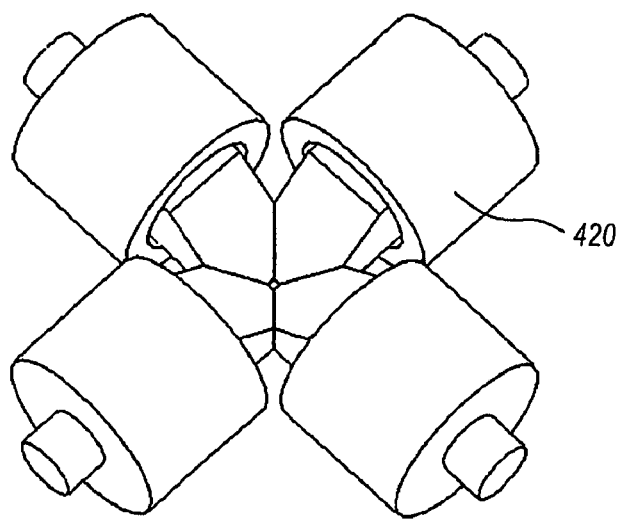
Figure 4H:
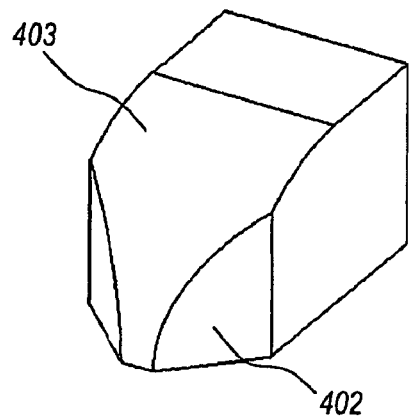
Figure 4I:
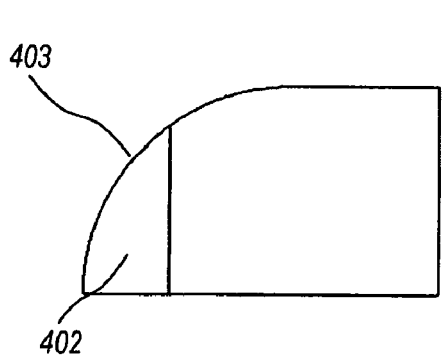
Figure 4J:
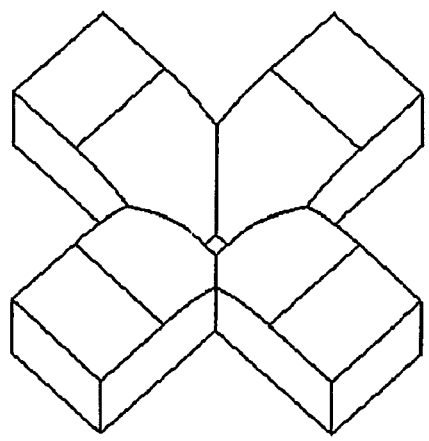

Another embodiment of the charged particle detector in accordance with the present invention will be described in detail with reference to FIGS. 4A through 4J. FIG. 4A to FIG. 4C show the tilt, top and side views of a triangular prism-light guide segment 401, respectively. Two symmetric 45-degree chamfers 402 are made at the front interface between the sloped face 403 and the bottom face 404, forming a 90-degree angle β with a flat front 405. The bottom face 404 is first coated with scintillator material (for example, phosphor scintillator such as P47) to form a detection surface, and then the whole light guide segment 401 is coated with aluminum or other reflective material for internal light reflection and light isolation between adjacent modules except for the light exit face 406. Four such segments created in the manner previously described 401 are then joined together through chamfer faces 402 to become a single detector light guide unit 400, of which the tilted top view, tilted bottom view, and top view are shown in FIG. 4D through FIG. 4F, respectively. The bottom faces 404 are aligned coplanarly to form a flat detection surface 407 as shown in FIG. 4E, and the flat front 405 forms a square center opening 408 as shown in the top view FIG. 4F. As viewed from the top the whole assembly is not only 90-degree rotational symmetric but also mirror symmetric with respect to the two orthogonal axes 410 and 411 passing through the center of the opening 408. This configuration has the benefit of complete symmetry in signal collection. When installed in a charged particle instrument, the opening 408 will be aligned with the center optical axis of the instrument for allowing the primary charged particle beam to pass through. The angle α between sloped face 403 and face 404 of each light guide segment can be any value between 0 and 90 degrees as shown in FIG. 4C, in accordance with the present invention. The light exit face 406 of each light guide segment is coupled to a PMT module 420 to allow light signals transmitted through each light guide segment to be converted, amplified and processed separately, as shown in FIG. 4G. Since the adjacent faces of each prism-light guide segment 401 is coated with reflective material prior to being assembled together, light being transmitted in each segment does not cross from one segment into another. It can be easily understood by people familiar with the art that this configuration constitutes an on-axis annular detector with four equal and independent segments. In this example, a straight light guide segment 409 is used for compactness and minimum loss of light intensity. However, within the scope of the present invention, various length and shape of solid or hollow light guide or optical fiber light guide can be incorporated in front of the PMT 420, as may be required due to practical needs by the instrument in which the detector will be installed. As in the case of the embodiments described in the above paragraph, even though a front section of triangular prism is employed for the prism-light guide segment 401 in this example, it by no means limits the shape of the front section to be triangular. Various shapes and curves can be applied to the sloped lace 403 in accordance with the present invention, as may be deemed necessary due to light collection efficiency consideration. For example, it can consist of several segments of straight sections with different slopes, or follow curved shapes, such as circular, parabolic, spherical or any other curved profile or surface. FIG. 4J shows one of such embodiments, where the face 403 of each light guide segment 401 has a circular profile as shown in its tilted view FIG. 4H and side view FIG. 4I.

Figure 5A:
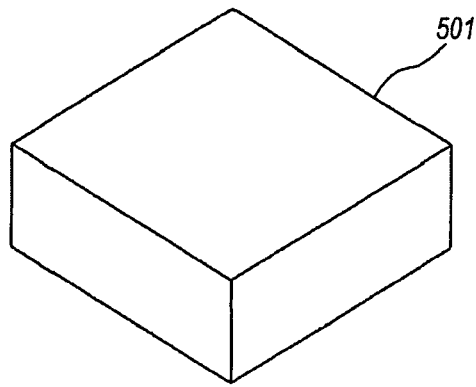
FIG. 5 shows detector assemblies in accordance with the third embodiment of the present invention.
Figure 5B:
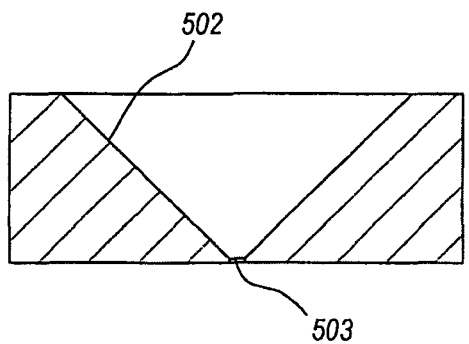
Figure 5C:
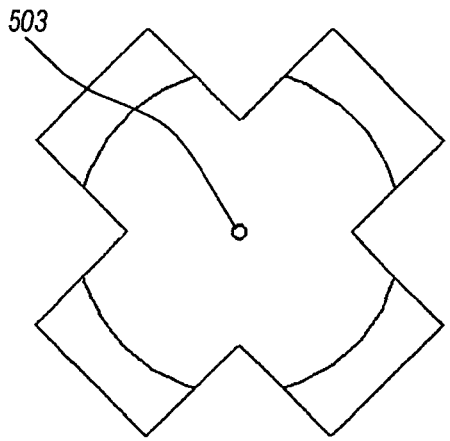
Figure 5D:
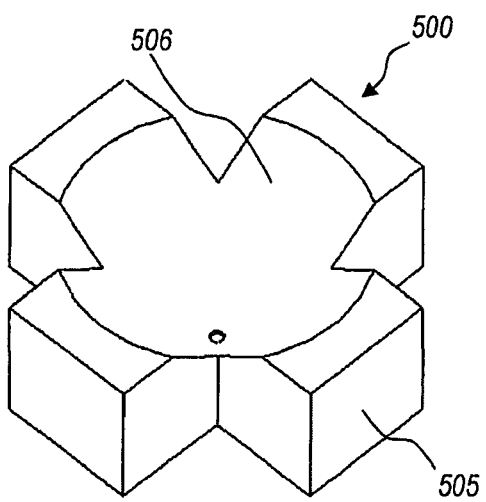
Figure 5E:
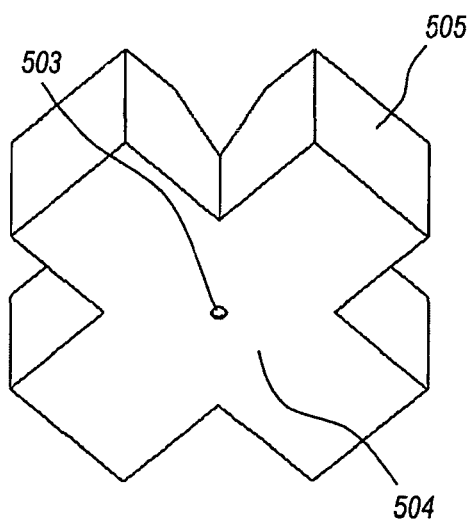
Figure 5F:
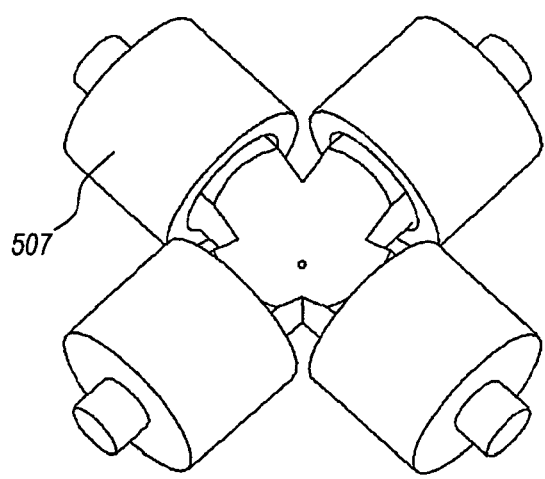

As disclosed above, four independent light guide segments can be assembled together to achieve the segmented on-axis annular configuration. This allows symmetric signal separation across two orthogonal axes (both X and Y axes of an image). However, for simplicity in manufacturing, it is also possible to approximate the segmented on-axis annular configuration by making the light guide assembly from a single piece of material. This type of embodiment of the charged particle detector in accordance with the present invention will be described in detail with reference to FIG. 5A through FIG. 5H. A single rectangular block of light guide material 501, as shown in FIG. 5A, is first prepared. A cone shaped circular cutout 502 is then made from the side of one square face, terminating on the opposite face to a center opening 503, as shown in FIG. 5B. Material is then removed from four corners of the rectangular block, forming four separate light guide paths with exiting faces 505 as shown in FIG. 5D. FIG. 5C to 5E show the top view, tilted top view and tilted bottom view of the resulting light guide module 500, respectively. The bottom face 504 containing the opening 503 is coated with scintillator material, acting as the charged particle detection surface, while other faces of the module are coated with aluminum of other reflective material for internal light reflection except for the light exit faces 505. When installed in a charged particle instrument, the opening 503 will be aligned with the center optical axis of the instrument for allowing the primary charged particle beam to pass through. Each of the light exit faces 505 is coupled to a PMT module 507 to allow light signals exited from each face 505 to be converted, amplified and processed separately, as shown in FIG. 5F. Since this embodiment consists of only a single piece of material, light exiting from each face 505 does have the possibility of coming from various part of the detection surface 504. However, with proper choice of shape for the light reflection face 506, it can be achieved that the majority of light exiting from each face 505 is coming from the detector quadrant right in front of each face 505. Thus effectively its performance will be similar to an on-axis annular detector with four equal and independent segments, but with the added benefits of simplicity and ease of manufacturing. Various profiles can be applied to the reflection face 506 in accordance with the present invention. For example, the reflection face can consist of several segments of straight lines with different slopes, or follow curved profiles such as circular, parabolic or any other shape. FIG. 5G shows one of such embodiments, where the face 506 has a circular profile as shown in the cross-section view in FIG. 5H. In addition, even though embodiments with four separate light guide output paths are given in accordance with the present invention, when segmented on-axis annular configuration is not desired for certain cases of application, number of output light guide paths other than four can also be used.

All the above embodiments have the bottom face of the light guide segment coated with scintillator materials as the charged particle detection surface in order to achieve the best light transfer efficiency. However, direct coating of scintillator onto light guide surface may be difficult for certain scintillator materials, such as single crystals or materials only available as pre-coated on substrates. In accordance with the present invention, in those eases direct coating on the light guide segment can be skipped and scintillator material in the form of a separate plate (for example, a single crystal disc of YAP or YAG material) or coating on a separate plate (for example, a glass or quartz disc coated with phosphor scintillator) can be attached to the bottom face of the light guide assembly with the use of epoxy bonding or through mechanical means. In these embodiments, the area on the bottom face of the light guide segment which will be coupled to the separate scintillator material will not be coated with aluminum or any other light reflection material, in order to allow light to transmit through. FIG. 6 shows one of such embodiments, where a scintillator disc 600 is attached to one of the above disclosed embodiments, the prism-light guide assembly 400 (as shown in FIG. 4E) as an example, to form a detector light guide assembly. The thin disc 600 is connected to the bottom face 404 and can be a single crystal of scintillator material or a light guide material coated with scintillator on its bottom surface 601. The center hole 602 of the disc 600 is aligned with the center hole 407 of the assembly 400 to allow passage of the primary charged particle beam when installed in a charged particle instrument.

Figure 7:
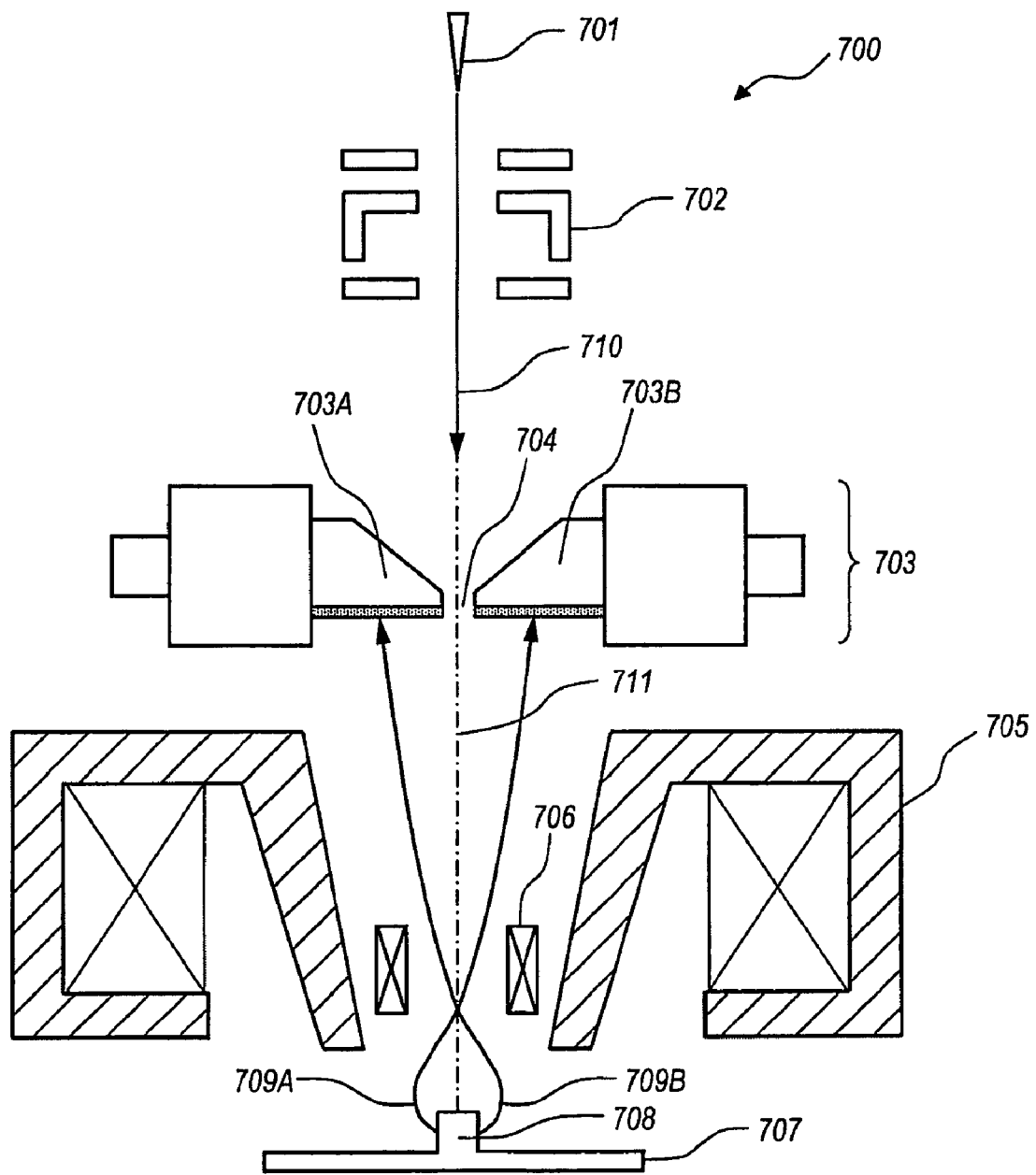
FIG. 7 is a schematic illustration of a detector assembly in accordance with the present invention being installed in a SEM as a segmented on-axis annual detector.

The incorporation of all the above-disclosed embodiments of the charged particle detector in accordance with the present invention into a charged particle beam instrument is schematically illustrated in FIG. 7. A scanning electron microscope (SEM) 700 is shown, consisting of an electron source 701, a condenser lens 702, a magnetic objective lens 705, a deflection unit 706, a specimen 707, and a segmented on-axis annular detector 703 in accordance with the present invention, with the center opening 704 of the detector 703 aligned with the optical axis 711 of the SEM 700. In this example, only the embodiment as shown in FIG. 4G is illustrated, and for clarity only two out of the four detector quadrants are shown as 703A and 703B. Other embodiments can be incorporated in the same fashion. Primary electron beam 710, emanated from the electron source, passing through the center opening of the detector, strikes the specimen surface and generates secondary and back-scattered electrons. Two secondary electrons trajectories are illustrated as 709A and 709B. These two secondary electrons, emitted from either side of a surface feature 708 in different directions, with 709A to the left and 709B to the right, are pulled into the bore of the objective lens and cross the center optical axis by the combined actions of the immersion magnetic field and the electric retarding field, before arriving at the detector at opposite quadrants, with 709A arrives at 703B while 709B arrives at 703A. Independent outputs from the opposite detector quadrants will then show images of the surface feature 708 with edge shadowing effect of the opposite phase. The SEM specifically illustrated in FIG. 7 by no means limits the application of the present invention to this type of instrument with the above-described configurations. Embodiments in accordance with the present invention may be incorporated in a similar fashion in various types of charged particle instruments of different configurations.

Although the present invention has been described in accordance with the embodiments shown, one of ordinary skill in the art will readily recognize that there could be variations to the embodiments and those variations would be within the spirit and scope of the present invention. Accordingly, many modifications may be made by one of ordinary skill in the art without departing from the spirit and scope of the appended claims.

What is claimed is:

1. A charged particle detector for detecting secondary electrons, comprising:
   a light guide assembly including a plurality of light guide segments, with each light guide segment coupled to a photomultiplier tube, the light signal output from each segment to be converted, amplified and processed separately, wherein the light guide assembly comprises four independent light guide modules assembled together in an off-center fashion, in a 90-degree rotational symmetric configuration, with one equivalent surface on each light guide module aligned coplanarly to form a flat surface, the light guide assembly configured for collection and detection of a narrow angular distribution of secondary electrons with an opening on the center axis; and
   a scintillator layer coupled to each light guide for generating light upon being bombarded by a charged particle beam.

2. The detector of claim 1, wherein the opening comprises a square opening.

3. The detector of claim 2, wherein the flat surface formed by aligning one equivalent surface of each light guide module coplanarly includes a scintillator material coupled thereto to form a charged particle detection surface.

4. The detector of claim 2, wherein each of the four independent light guide modules comprises a right angle prism.

5. The detector of claim 1, wherein the flat surface formed by aligning one equivalent surface of each light guide module coplanarly includes a scintillator material coupled thereto to form a charged particle detection surface.

6. The detector of claim 1, wherein the scintillator layer comprises a coating directly coupled on the light guide assembly.

7. The detector of claim 1, wherein a light reflection face directly facing the scintillator layer on each light guide segment in the segmented light guide assembly have various shapes or profiles, including profiles consisting of single or multiple sections of straight lines, or have circular or parabolic profiles, or be of spherical or any other curved profile or surface.

8. A charged particle detector for detecting secondary electrons, comprising:
   a light guide module, with a plurality of separate light guide output channels, each channel is coupled to a photomultiplier tube for the light signal output from each channel to be converted, amplified and processed separately, the light guide module coupled on an objective lens of a charged particle beam apparatus; and
   a scintillator layer for generating light upon being bombarded by the charged particle beam.

9. The detector of claim 8, wherein the light guide module has a cone shaped circular cutout from one face, terminating on the opposite face to an opening, wherein the surface of the cone shaped circular cutout can have profiles consisting of single or multiple sections of straight lines, or have circular or parabolic profiles.

10. The detector of claim 9, wherein the opposite face with an opening of the light guide module includes a scintillator material coupled thereto to form a charged particle detection surface.

11. The detector of claim 8, wherein the outer region of the light guide module is shaped to form four separate light guide channels for light output, wherein the whole light guide module has mirror symmetric configuration with respect to two perpendicular lines of symmetry.

12. The detector of claim 11, wherein each of the four separate light guide channels is coupled to a photomultiplier tube for the light output from each light guide channel to be converted, amplified and processed separately.

13. A charged particle detector, comprising:
a light guide assembly including a plurality of light guide segments, with each light guide segment coupled to a photomultiplier tube, the light signal output from each segment to be converted, amplified and processed separately, the light guide assembly coupled on an objective lens of a charged particle beam apparatus; and
a scintillator layer coupled to each light guide segment for generating light upon being bombarded by the charged particle beam.

14. The detector of claim 13, wherein the light guide assembly comprises four independent light guide modules coupled assembled together in an off-center fashion, in a 90-degree rotational symmetric configuration, with a square opening on the center symmetric axis, and with one equivalent surface on each light guide module aligned coplanarly to form a flat surface.

15. The detector of claim 14, wherein the flat surface formed by aligning one equivalent surface of each light guide module coplanarly includes a scintillator material coupled thereto to form a charged particle detection surface.

16. The detector of claim 14, wherein each of the four independent light guide modules comprises a right angle prism.

17. The detector of claim 13, wherein the segmented light guide assembly comprises four independent light guide modules assembled together in a mirror symmetric configuration with respect to two perpendicular lines of symmetry, including an opening on the center symmetric axis, and with one equivalent surface on each light guide module aligned coplanarly to form a flat surface.

18. The detector of claim 17, wherein the flat surface formed by aligning one equivalent surface of each light guide module coplanarly includes a scintillator material coupled thereto to form a charged particle detection surface.

19. The detector of claim 13, wherein the scintillator layer comprises a coating directly coupled on the light guide assembly.

20. The detector of claim 13, wherein a light reflection face directly facing the scintillator layer on each light guide segment in the segmented light guide assembly have various shapes or profiles, including profiles consisting of single or multiple sections of straight lines, or have circular or parabolic profiles, or be of spherical or any other curved profile or surface.

21. A method for forming a charged particle detector, comprising:
forming a scintillator material on each leg face of four individual prisms;
coating a reflective material on the four individual prisms except each light exit face of the four individual prisms for internal light reflection and light isolation; and
assembling the four individual prisms with the each leg face coplanarly as a flat detection surface in an off-center configuration, and in a 90-degree rotational symmetric configuration.

* * * * *